(12) United States Patent
Strauss et al.

(10) Patent No.: US 9,214,045 B1
(45) Date of Patent: Dec. 15, 2015

(54) FLASH MEMORY EXPRESS ERASE AND PROGRAM

(71) Applicants: Timothy J. Strauss, Granger, IN (US); Thomas Jew, Austin, TX (US)

(72) Inventors: Timothy J. Strauss, Granger, IN (US); Thomas Jew, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/473,418

(22) Filed: Aug. 29, 2014

(51) Int. Cl.
*G06F 12/00* (2006.01)
*G06F 13/00* (2006.01)
*G07C 5/08* (2006.01)
*G11C 16/14* (2006.01)

(52) U.S. Cl.
CPC ............... *G07C 5/085* (2013.01); *G11C 16/14* (2013.01)

(58) Field of Classification Search
CPC ...... G11C 16/225; G11C 16/10; G11C 16/14; G06F 11/1441; G06F 11/2015; G06F 9/45512; G06F 9/4812; G07C 5/085

USPC ............... 365/226; 700/79; 714/6.11, 14, 22; 701/29.2
See application file for complete search history.

(56) References Cited

U.S. PATENT DOCUMENTS

| 5,509,134 A | 4/1996 | Fandrich et al. |
| 2002/0116588 A1* | 8/2002 | Beckert ............... G06F 11/1441 711/161 |
| 2006/0224804 A1 | 10/2006 | Alexandre |
| 2011/0055453 A1 | 3/2011 | Bennett |

FOREIGN PATENT DOCUMENTS

| WO | 9744792 A1 | 11/1997 |
| WO | 9956394 A1 | 11/1999 |

* cited by examiner

*Primary Examiner* — Adam Tissot
(74) *Attorney, Agent, or Firm* — Jonathan N. Geld

(57) ABSTRACT

A mechanism for express storage of sensor data in response to an indication of a power fluctuation, power brownout or blackout that can affect operation of a microcontroller is provided. Embodiments provide a flash memory having memory space allocated to express storage of the sensor data, and a protocol machine configured to provide the desired information to reserved registers associated with express program/erase operations accessing the allocated memory space.

17 Claims, 3 Drawing Sheets

FLASH MEMORY EXPRESS ERASE AND PROGRAM

BACKGROUND

1. Field

This disclosure relates generally to flash memory array erasing and programming, and more specifically, to a mechanism for programming a flash memory in response to an indication of a need to quickly store information in the flash memory.

2. Related Art

Present day vehicles rely upon the use of multiple microcontrollers and associated sensors to provide smooth operation of the engine, safety equipment, driver assistance mechanisms, and infotainment systems within the vehicle. These microcontrollers and sensors can be coupled via networks using a variety of protocols. Data can be shared between the various microcontrollers, much of it essential to the smooth and safe operation of the vehicle.

Vehicles can experience significant power fluctuations, power brownouts or blackouts during operation due to, for example, failure or impending failure of a battery or an alternator, rough road surfaces causing intermittent power connection failure, or a crash. During such significant power fluctuations it can be desirable to store certain sensor information so that the information can be later accessed to diagnose what problems were occurring in the vehicle during the course of the power fluctuation. But since the very nature of a significant power fluctuation may cause electronic components, such as microcontrollers, to cease to operate, such storage of sensor information needs to be performed very quickly, in many cases in less than 10 milliseconds after detection of the power fluctuation. Present vehicle systems are not configured to perform such fast storage of sensor information.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for express storage of sensor data in response to an indication of a power fluctuation, power brownout or blackout that can affect operation of a microcontroller. Embodiments provide a flash memory having memory space allocated to express storage of the sensor data, and a protocol machine configured to provide the desired information to reserved registers associated with express program/erase operations accessing the allocated memory space.

A typical vehicle can have a number of microcontrollers or other microprocessors coupled to a variety of sensors via one or more networks. These microcontrollers can govern engine operation, infotainment center operation, and safety device operation, to name a few. The information exchanged between the microcontrollers and the sensors can be of importance in the event of a vehicular event that results in a break in performance of the microcontrollers. Such events can include significant power fluctuations, vehicular crashes, security breaches, and the like. By their nature, in order to store data during such vehicular events, a rapid transfer of that data to non-volatile memory (e.g., flash memory) must be performed. Embodiments of the present invention provide a mechanism to perform such rapid data transfer.

Figure 1:
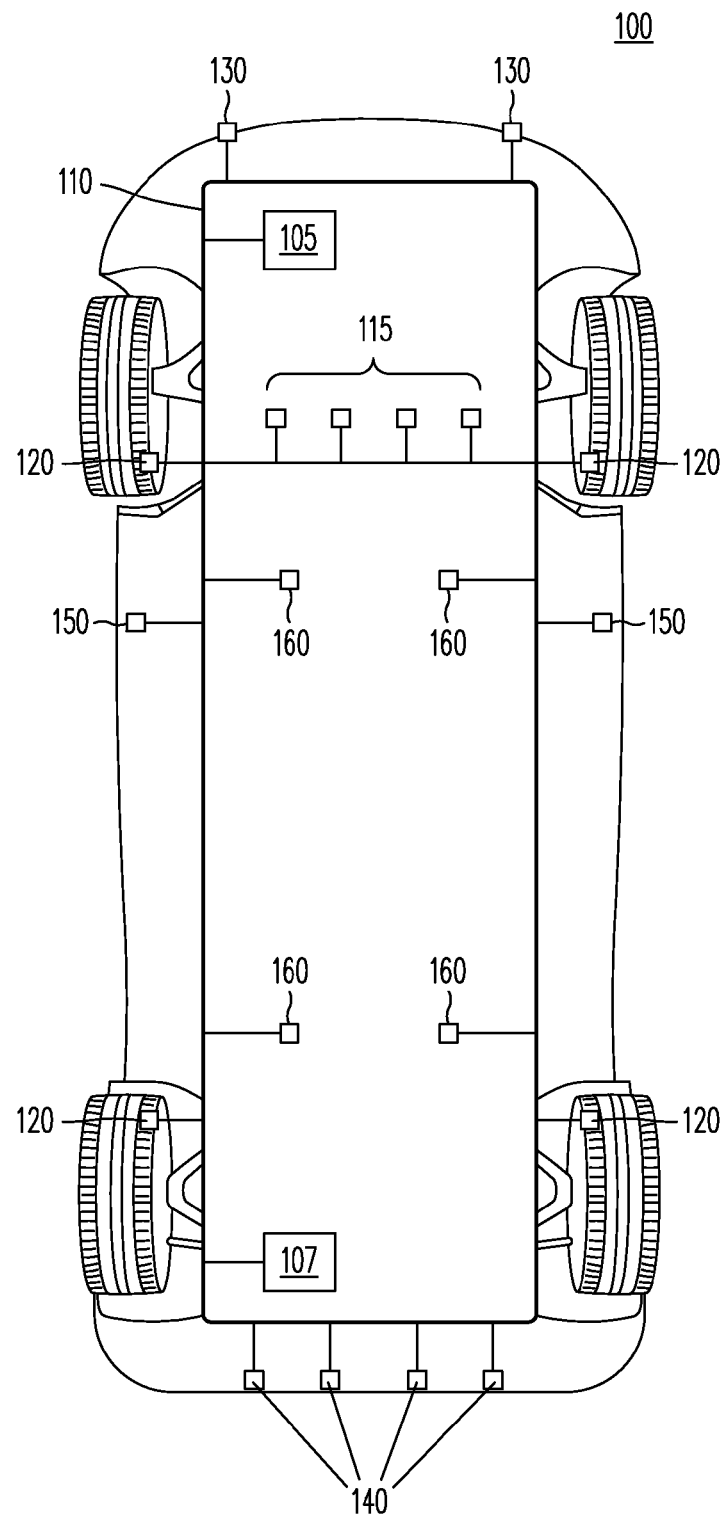
FIG. 1 illustrates a plan view of a vehicle that includes microcontrollers, sensors, and a network connecting them.

FIG. 1 illustrates a plan view of a vehicle that includes microcontrollers, sensors, and a network connecting them. Vehicle 100 includes one or more microcontrollers 105 and 107 coupled to a network 110 (e.g., a controller area network (CAN)). Network 110 can couple the microcontrollers to one another, allowing for information to be shared between the microcontrollers, and to a set of sensors, displays, and other input sources. Illustrated in FIG. 1 are a variety of sensors that can provide input to microcontrollers 105 and 107. Engine sensors 115 provide information regarding engine characteristics. Tire pressure sensors 120 provide information regarding the current pressure in the tires. Front impact sensors 130 can provide information related to a current crash or other impact to the front end of the vehicle. Similarly, rear impact sensors 140 can provide information related to a crash or other impact to the rear of the vehicle. Side impact sensors 150 can provide information related to a crash or other impact to the side of the vehicle. There can also be a set of interior sensors 160 that can provide information related to the interior environment of the vehicle. These types of sensors are not an exclusive list, and additional sensors can be provided such as video cameras, internal and external temperature sensors, lighting sensors, driver assist sensors, radars, and the like.

Much of the information provided by the sensors can be used to determine whether the vehicle is operating within the desired parameters for such a vehicle. The data can also indicate whether the vehicle is undergoing some sort of unusual stress, such as engine component failure, tire failure, collision impact, power loss and the like. The information can be used to determine what parts of the vehicle may be in the process of failing or in a failure condition. Thus, storing this information during a vehicular event (e.g., a power failure or a collision) can be useful in diagnosing the cause of the vehicular event during a post mortem analysis.

Typical microcontrollers have associated memory, including flash memory, used to store sensor data, state information, intermediate calculation data, and the like. A flash memory includes an associated program/erase controller that accesses the flash array. In typical operations, in order to store data, the program/erase controller will perform a variety of checks on the section of the flash array to be written to. This can include waiting for a current operation to finish or suspending that operation, handling any exceptions, checking the flash memory to determine if the flash memory is ready for being erased and programmed, erasing any current data in the target area of the flash memory, and then loading the data to the target area of the flash. Performing these operations can take hundreds of milliseconds to perform in their entirety.

During a vehicular event such as those discussed above, time may be of the essence in successfully getting desired data written to the flash. For example, during a significant power fluctuation or power outage event, if data is not written to the flash memory before the power drops below the functional voltage level of the microcontroller and program/erase controller, then the data will be lost. The time available to write the data during such an even can be on the order of tens of milliseconds. Thus, the typical program/erase operations discussed above take too long to ensure that all information desired to be stored in a vehicular event is successfully stored.

Figure 2:
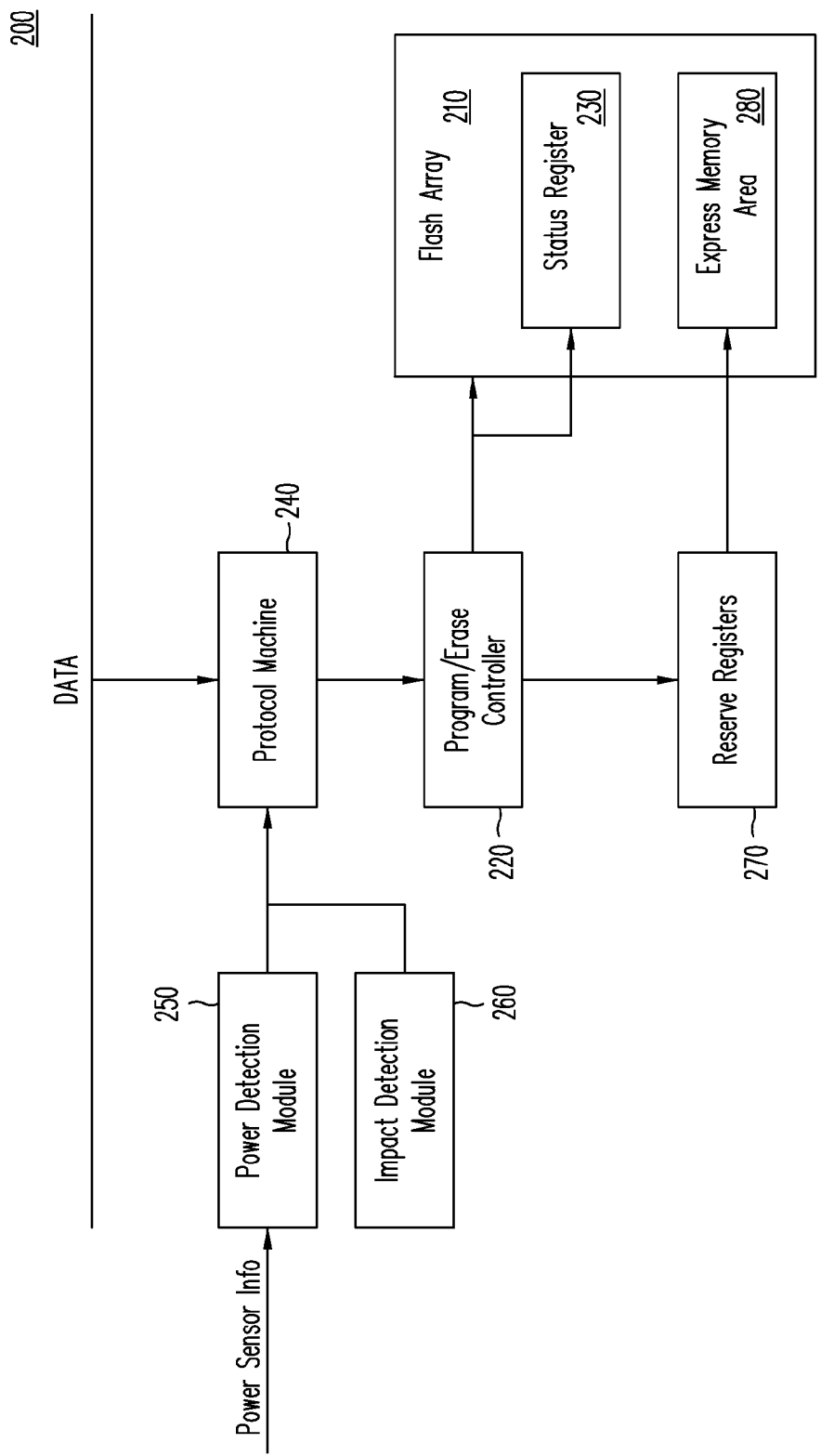
FIG. 2 is a simplified block diagram of a system for rapidly storing data to a flash memory in the event that a vehicular event necessitating such rapid storage occurs, in accord with embodiments of the present invention.

FIG. 2 is a simplified block diagram of a system 200 for rapidly storing data to a flash memory in the event that a vehicular event necessitating such rapid storage occurs. A flash array 210 is provided in association with, for example, a microcontroller. Flash array 210 is accessed by a program/erase controller 220. Program erase controller 220, during normal operations, executes a series of checks when erasing and programming sections of flash array 210. For example, program/erase controller 220 can wait to perform erase and program operations until a prior program/erase operation is complete, perform exception handling, check readiness of the flash array for erase and program operations, and load data to the flash. The program/erase controller can also store status information of pending and executing operations in a set of status registers 230 provided in association with the flash array. Information stored in status registers 230 can aid in the restoration of the state of the microcontroller after an operation has been performed necessitating resumption of operations.

As discussed above, during a vehicular event, there may not be sufficient time to perform all the checks normally performed by the program/erase controller. Embodiments of the present invention provide a protocol machine 240 that is configured to determine when a vehicular event is in progress and instructs program/erase controller 220 to bypass the typical checks. Protocol machine 240 can receive information from one or more sensors that are configured to detect when a vehicular event is in progress. Such a sensor can include a power detection module 250 or an impact detection module 260, for example. Power detection module 250 can include sensors or circuitry that can detect when significant power fluctuations, power brownouts, or power blackouts are occurring that will affect the normal operation of the microcontroller. The detection modules 250 and 260 can send signals to protocol machine 240 that indicate the need to perform an express program/erase operation.

During an express program/erase operation, protocol machine 240 instructs program/erase controller 220 to bypass certain of the typical checks performed for program and erase operations. Protocol machine 240 instructs program/erase controller 220 to write data desired to be stored by express operations to reserve registers 270. The data will then be transferred from the reserve registers to a designated express memory area 280 in the flash array. Express memory area 280 is a memory area of flash array 210 that is designated in the write commands associated with the data.

Instead of performing normal operational checks, in response to receiving express program/erase commands from protocol machine 240, program/erase controller 220 automatically aborts or suspends pending operations to the flash, blocks access to the flash by other processes, and then performs express erase and program operations to the express memory area. In order to streamline operations, no exception handling is performed when the program/erase controller is performing express operations.

In addition, when the program/erase controller performs the automatic abort/suspension operations, status information regarding operations pending when the express program/erase operation begins is written to status registers 230 so that when the vehicular event is over, operations can be resumed by the microcontroller and flash by reading the status information. The status information can include, for example, information regarding the pending operations that were suspended, as well as an indication of the type of vehicular event that prompted the express program/erase operations.

Effectively, embodiments of the present invention provide an alternate high priority interface to the flash memory that allows for rapid saving of selected data to the flash prior to the flash becoming unavailable due to a vehicular event. In light of the short period of time (e.g., approximately 10 milliseconds), the amount of data being saved to the flash during such an event will be relatively small. A typical amount of data being saved during such an express operation can be about one kilobit (about 128 bytes).

Figure 3:
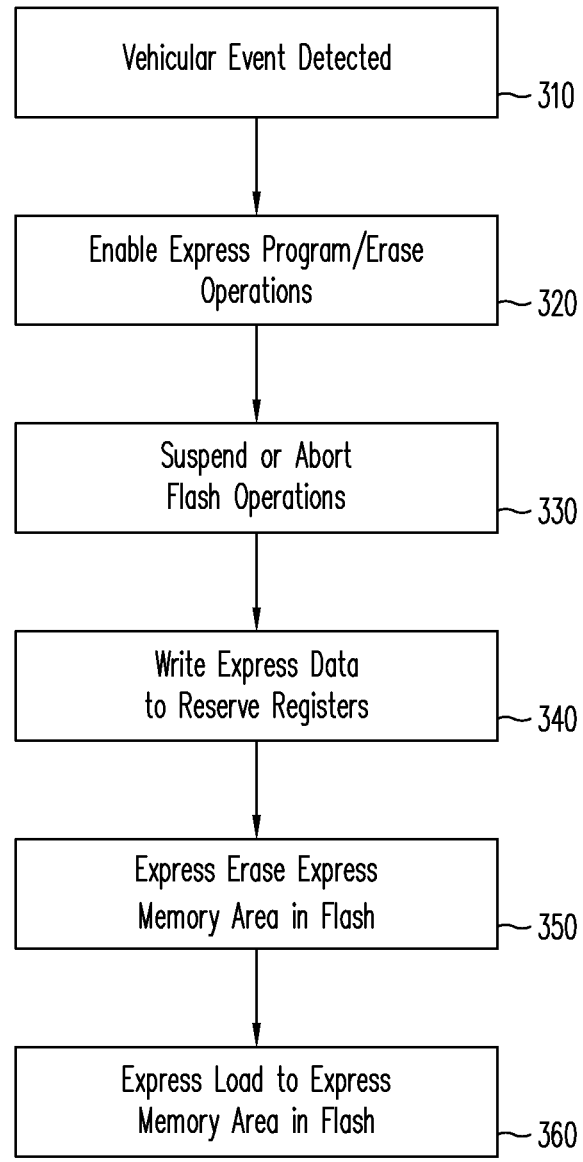
FIG. 3 is a simplified flow diagram illustrating a method of express program/erase performed by embodiments of the present invention.

FIG. 3 is a simplified flow diagram illustrating a method of express program/erase performed by embodiments of the present invention. As discussed above, the process begins with detection of a vehicular event (310). The vehicular event can be detected by a variety of sensors, depending upon the vehicular event being responded to. For example, power sensors can be coupled to the vehicle's power supply lines or within a microcontroller monitoring the power supplied to the microcontroller. Upon detection of a significant power fluctuation, power brownout, or blackout, the sensors can provide information to the flash associated protocol machine (e.g., protocol machine 240), which can begin responding to the information. Similarly, vehicle crash sensors can provide information indicative of an impact, or other sensors may provide information indicative of a security breach that needs to be responded to. Embodiments of the present invention are not limited to the nature of the vehicular event necessitating an express program/erase operation.

Once information regarding the occurrence of the vehicular event is received, express program/erase operations are enabled (320). This can be performed by protocol machine 240 sending a signal to program/controller 220. The program/erase controller can then suspend or abort pending flash operations (330). This suspend/abort of the pending flash operations clears the way for express program/erase operations to occur. The program/erase controller will store state information related to the pending operations in status registers provided in the flash array or alternatively in a memory external to the flash array. The state information can be used subsequent to the vehicular event to resume operations (e.g., in the event of a recovery from a power brownout or significant power fluctuation), so that, for example, operation of the vehicle, or at least the microcontrollers, can continue subsequent to the event.

While the automatic suspend/abort of the pending flash operations is occurring, the data that is desired to be preserved by the express program/erase operations can be written to a set of reserve registers (e.g., reserve registers 270). The data can be written to the reserve registers by program/erase controller 220 or directly by protocol machine 240. Since the goal of the express program/erase operation is to store this data in the flash array prior to loss of operational power, getting the data temporarily stored in the reserve registers quickly is desirable. Whether this is accomplished by the protocol machine or the program/erase controller is dependent upon the application. Embodiments of the present invention are not limited by the means in which the data is provided to the reserve registers.

The data to be written to the flash array will also include locations in the flash array in which to store the data (i.e., express memory area 280). Once the automatic suspend/abort operations have been completed, the program/erase controller can perform express erase operations on the target memory locations of the express memory area in the flash (350). These express erase operations, and the subsequent express program operations, are performed without performing the typical protocols for program and erase of the flash array. After an express erase operation is completed for a memory area, the corresponding data in a reserve registers can be loaded to the memory area (360). These express erase and express load operations can continue until all the data desired to be stored is provided to the express memory area, or until operational power is no longer available to the microcontroller and flash array.

Embodiments of the present invention therefore provide a mechanism by which desired information can be stored during a vehicular event that can cause cessation of operations of microcontrollers or the vehicle itself. Such information can be used to diagnose what occurred in the vehicle while the vehicular event was proceeding. Embodiments also provide a mechanism for storing current state information regarding the microcontroller, and allow for resumption of operations once steady power has been provided to the microcontroller.

By now it should be appreciated that there has been provided a memory system that includes a flash memory array configured to store data, a program/erase controller coupled to the flash memory array and configured to perform a plurality of operations in conjunction with storing data in the flash memory array, and a protocol machine coupled to the program/erase controller. The protocol machine is configured to interrupt an operation performed by the program/erase controller in response to a vehicular event and to instruct the program/erase controller to bypass one or more of the plurality of operations while storing selected data in the flash memory array.

One aspect of the above embodiment further includes one or more reserve registers that are coupled to the program/erase controller and the protocol machine. The reserve registers store the selected data prior to the selected data being stored in the flash memory array in response to the vehicular event. In a further aspect, the protocol machine reads the selected data from the reserve register prior to storing the selected data in the flash memory array.

In another aspect of the above embodiment, the program/erase controller is further configured to store state information corresponding to the interrupted operation upon performing the interrupting. In a further aspect, the memory system includes one or more status registers configured to store the state information corresponding to the interrupted operation. In a still further aspect, the flash memory array includes the one or more status registers.

In another aspect of the above embodiment, the flash memory array includes one or more express memory areas configured to store the selected data. In a further aspect, the program erase controller is configured to erase any data stored in the express memory areas in response to the vehicular event and prior to storing the selected data.

In yet another aspect of the above embodiment, the vehicular event includes an indication of an event in which insufficient power can be applied to the memory system for normal operation subsequent to the vehicular event. In a further aspect, the memory system further includes a network coupled to the protocol machine and one or more sensors coupled to the network. The indication of the event in which insufficient power can be applied to the memory system includes data transmitted by a sensor of the one or more sensors.

Another embodiment of the present invention provides a method for storing data associated with a vehicular event. The method includes suspending memory operations in response to a signal indicative of the vehicular event, express erasing previous data from a memory location to which the data associated with the vehicular event is to be stored, and express storing the data associated with the vehicular event in the memory location. The express erasing and storing bypass the normal memory erasing and storing exception handling and readiness checking.

In a further aspect of the above embodiment, the method further includes temporarily storing the data associated with the vehicular event in one or more reserve registers. The express storing includes loading the data associated with the vehicular event from a reserve register to the memory location. In still a further aspect, the loading of the data associated with the vehicular event is performed subsequent to suspending memory operations and express erasing.

In another aspect of the above embodiment, the signal indicative of the vehicular event is generated in response to information received from one or more sensors in the vehicle. In a further aspect, the information received is indicative of a power brownout or power blackout in the vehicle. In another further aspect, the information received is indicative of a crash of the vehicle.

Another embodiment of the present invention provides a vehicle that includes a microcontroller unit, a network coupled to the microcontroller unit, and one or more sensors coupled to the network and configured to transmit signals on the network to the microcontroller unit. The microcontroller unit includes a processor, a flash memory array coupled to the processor and configured to store data, a program/erase controller coupled to the flash memory array and configured to perform a plurality of operations in conjunction with storing data in the flash memory array, and a protocol machine coupled to the program/erase controller. The protocol machine is configured to interrupt an operation performed by the program/erase controller in response to information regarding an event in the vehicle, and instruct the program/erase controller to bypass one or more of the plurality of operations while storing selected data in the flash memory array. In addition, a sensor of the one or more sensors is configured to detect the event in the vehicle and to transmit the information regarding the event to the microcontroller unit.

In one aspect of the above embodiment, a subset of the one or more sensors are configured to transmit the selected data to the microcontroller unit. In a further aspect, the vehicle event is when insufficient power can be applied to the microcontroller unit and the subset of the one or more sensors is configured to detect the vehicle event. In a still further aspect, storing the selected data is performed within a response time for the vehicle event.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 200 are circuitry located on a single integrated circuit or within a same device. Alternatively, system 200 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system comprising:
a flash memory array configured to store data;
a program/erase controller coupled to the flash memory array and configured to perform a plurality of operations in conjunction with storing data in the flash memory array; and
a protocol machine coupled to the program/erase controller and configured to interrupt an operation performed by the program/erase controller in response to a vehicular event, and
instruct the program/erase controller to bypass one or more of the plurality of operations while storing selected data in the flash memory array, wherein the vehicular event comprises an indication of an event in which insufficient power can be applied to the memory system for normal operation subsequent to the vehicular event; and
one or more reserve registers, coupled to the program/erase controller and the protocol machine, and configured to store the selected data prior to the selected data being stored in the flash memory array in response to the vehicular event.

2. The memory system of claim 1 wherein the protocol machine reads the selected data from a reserve register prior to said storing the selected data in the flash memory array.

3. The memory system of claim 1 wherein the program/erase controller is further configured to store state information corresponding to the interrupted operation upon performing said interrupting.

4. The memory system of claim 3 further comprising one or more status registers configured to store the state information corresponding to the interrupted operation.

5. The memory system of claim 4 wherein the flash memory array comprises the one or more status registers.

6. The memory system of claim 1 wherein the flash memory array comprises one or more express memory areas configured to store the selected data.

7. The memory system of claim 6 wherein the program/erase controller is configured to erase any data stored in the express memory areas in response to the vehicular event and prior to said storing the selected data.

8. The memory system of claim 1 further comprising:
a network coupled to the protocol machine; and
one or more sensors coupled to the network, wherein the indication of the event in which insufficient power can be applied to the memory system comprises data transmitted by a sensor of the one or more sensors.

9. A method for storing data associated with a vehicular event, the method comprising:
suspending memory operations in response to a signal indicative of the vehicular event, wherein the vehicular event is an event in which insufficient power can be applied to a memory system performing the memory operations subsequent to the vehicular event;
express erasing previous data from a memory location to which the data associated with the vehicular event is to be stored; and
express storing the data associated with the vehicular event in the memory location, wherein said express erasing and express storing bypass normal memory erasing and storing exception handling and readiness checking, and
said express storing comprises loading the data associated with the vehicular event from a reserve register of the one or more reserve registers to the memory location.

10. The method of claim 9 wherein said loading the data associated with the vehicular event is performed subsequent to said suspending memory operations and express erasing.

11. The method of claim 9, wherein
the signal indicative of the vehicular event is generated in response to information received from one or more sensors in a vehicle.

12. The method of claim 11 wherein the information received is indicative of a power brownout or power blackout in the vehicle.

13. The method of claim 11 wherein the information received is indicative of a crash of the vehicle.

14. A vehicle comprising:
a microcontroller unit comprising
a processor,
a flash memory array, coupled to the processor, and configured to store data,
a program/erase controller, coupled to the flash memory array, and configured to perform a plurality of operations in conjunction with storing data in the flash memory array, and
a protocol machine, coupled to the program/erase controller, and configured to interrupt an operation performed by the program/erase controller in response to information regarding an event in the vehicle, and instruct the program/erase controller to bypass one or more of the plurality of operations while storing selected data in the flash memory array, wherein the information regarding the event comprises an indication of an event in which insufficient power can be applied to the microcontroller unit for normal operation subsequent to the event, and one or more reserve registers, coupled to the program/erase controller and the protocol machine, and configured to store the selected data prior to the selected data being stored in the flash memory array in response to the vehicular event;

a network coupled to the microcontroller unit; and one or more sensors, coupled to the network, and configured to transmit signals on the network to the microcontroller unit, wherein a sensor of the one or more sensors is configured to detect the event in the vehicle and to transmit the information regarding the event to the microcontroller unit.

15. The vehicle of claim 14, wherein a subset of the one or more sensors are configured to transmit the selected data to the microcontroller unit.

16. The vehicle of claim 15 wherein the vehicle event is when insufficient power can be applied to the microcontroller unit and the subset of the one or more sensors is configured to detect the vehicle event.

17. The vehicle of claim 16 wherein said storing the selected data is performed within a response time for the vehicle event.

* * * * *